(12) United States Patent
Weigel et al.

(10) Patent No.: US 8,283,260 B2
(45) Date of Patent: Oct. 9, 2012

(54) PROCESS FOR RESTORING DIELECTRIC PROPERTIES

(75) Inventors: Scott Jeffrey Weigel, Allentown, PA (US); Mark Leonard O'Neill, Allentown, PA (US); Mary Kathryn Haas, Emmaus, PA (US); Laura M. Matz, Allentown, PA (US); Glenn Michael Mitchell, Sellersville, PA (US); Aiping Wu, Macungie, PA (US); Raymond Nicholas Vrtis, Orefield, PA (US); John Giles Langan, Pleasanton, CA (US)

(73) Assignee: Air Products and Chemicals, Inc., Allentown, PA (US)

( * ) Notice: Subject to any disclaimer, the term of this patent is extended or adjusted under 35 U.S.C. 154(b) by 377 days.

(21) Appl. No.: 12/540,395

(22) Filed: Aug. 13, 2009

(65) Prior Publication Data

US 2010/0041234 A1     Feb. 18, 2010

Related U.S. Application Data

(60) Provisional application No. 61/089,654, filed on Aug. 18, 2008.

(51) Int. Cl.
*H01L 21/302* (2006.01)

(52) U.S. Cl. ........ 438/756; 438/745; 438/757; 438/795; 216/99

(58) Field of Classification Search .................. 439/745, 439/750, 553, 756, 757; 438/708, 709, 745, 438/750, 753, 757, 795; 216/66, 99, 103
See application file for complete search history.

(56) References Cited

U.S. PATENT DOCUMENTS

| 6,054,206 | A | 4/2000 | Mountsier |
| 6,054,379 | A | 4/2000 | Yau et al. |
| 6,159,871 | A | 12/2000 | Loboda et al. |
| 6,171,945 | B1 | 1/2001 | Mandal et al. |
| 6,846,575 | B2 | 1/2005 | Hasz et al. |
| 7,029,826 | B2 | 4/2006 | Hacker et al. |
| 7,718,590 | B2 * | 5/2010 | Suzuki et al. ............ 510/175 |
| 2003/0054115 | A1 * | 3/2003 | Albano et al. ............ 427/487 |
| 2006/0057855 | A1 | 3/2006 | Ramos et al. |
| 2008/0076262 | A1 * | 3/2008 | Kevwitch et al. ......... 438/745 |
| 2008/0169004 | A1 | 7/2008 | Wu |

FOREIGN PATENT DOCUMENTS

WO     99/41423     8/1999

OTHER PUBLICATIONS

Scott Jeffrey Weigel, et al, U.S. Appl. No. 12/023,552, Jan. 31, 2008, Activated Chemical Process for Enhancing Material Properties of Dielectric Films.

* cited by examiner

*Primary Examiner* — Lan Vinh
(74) *Attorney, Agent, or Firm* — Lina Yang

(57) ABSTRACT

A method for preparing an interlayer dielectric to minimize damage to the interlayer's dielectric properties, the method comprising the steps of: depositing a layer of a silicon-containing dielectric material onto a substrate, wherein the layer has a first dielectric constant and wherein the layer has at least one surface; providing an etched pattern in the layer by a method that includes at least one etch process and exposure to a wet chemical composition to provide an etched layer, wherein the etched layer has a second dielectric constant, and wherein the wet chemical composition contributes from 0 to 40% of the second dielectric constant; contacting the at least one surface of the layer with a silicon-containing fluid; optionally removing a first portion of the silicon-containing fluid such that a second portion of the silicon-containing fluid remains in contact with the at least one surface of the layer; and exposing the at least one surface of the layer to UV radiation and thermal energy, wherein the layer has a third dielectric constant that is restored to a value that is at least 90% restored relative to the second dielectric constant.

8 Claims, No Drawings

PROCESS FOR RESTORING DIELECTRIC PROPERTIES

CROSS REFERENCE TO RELATED APPLICATIONS

This application claims the benefit of U.S. Provisional Patent Application Ser. No. 61/089,654 filed 18 Aug. 2008.

BACKGROUND OF THE INVENTION

The present invention relates to a method for restoring and/or enhancing the material properties of a dielectric material. More particularly, the invention relates to a method for restoring hydrophobicity to the surfaces of low dielectric films which have been subjected to an etching or ashing treatment in such a way as to remove at least a portion of previously existing carbon containing moieties, resulting in a film having reduced hydrophobicity and increased dielectric constant. Such films are used as insulating materials in the manufacture of semiconductor devices such as integrated circuits ("ICs").

As semiconductor devices scale to lower technology nodes, the requirement for lower and lower dielectric constant (k) has been identified to mitigate RC (resistance capacitance) delay. Similarly, as feature sizes in integrated circuits are reduced, problems with power consumption and signal cross-talk have become increasingly difficult to resolve. To achieve lower k (2.6 to 3.0) in dense inorganic materials, carbon has been added to reduce the polarizability thus reducing k. To achieve ultra low k (<2.4) materials, porosity is typically added to the carbon-rich dense matrix. While the introduction of carbon and porosity have reduced k, new challenges during back end of the line (BEOL) processing have also been identified. Specifically during processes such as, for example, etching and ashing, reactive gases have been found to damage the carbon at the surface of dense materials. Other processes such as, for example, wet chemical stripping, chemical mechanical planarization (CMP), and post-CMP cleaning are also known to damage the surface carbon. Porous low k's suffer more catastrophic effects from reactive etch and ash gases due to diffusion through the film, which causes a greater extent of damage throughout the film. Once the carbon has been removed from the films, the films react with atmospheric moisture and hydroxylate. These hydroxyls adsorb and hydrogen bond with water. Because water has a dielectric constant of about 70, small amounts that are absorbed for dense materials and adsorbed for porous materials cause the dielectric constant to increase significantly. Also, porous materials tend to void after copper annealing due to the high tensile stress fields which will destroy device yields.

It is believed that the integration of low dielectric constant materials for interlayer dielectric (ILD) and intermetal dielectric (IMD) applications will help to solve these problems. While there have been previous efforts to apply low dielectric constant materials to integrated circuits, there remains a long-standing need in the art for further improvements in processing methods and in the optimization of both the dielectric and mechanical properties of such materials. Device scaling in future integrated circuits clearly requires the use of low dielectric constant materials as a part of the interconnect structure. Most candidates for low dielectric constant materials for use in sub-100 nm generation ICs are carbon containing $SiO_2$ films formed by either chemical vapor deposition (CVD) or spin-on methods. During subsequent processing steps, such as plasma etching and photoresist removal using plasma or wet strip methods, significant damage occurs to these low-k materials, which causes fluorine addition and carbon depletion from the low-k material adjacent to the etched surface. In addition to a higher effective k, the resultant structures are susceptible to void formation, outgassing and blister formation. The voids in turn may cause an increase in leakage current at elevated voltages and reduction in breakdown voltage. Accordingly, there is a desire in the art to repair damage caused to a porous SiCOH-based low-k material.

One way to approach this challenge is to repair the damaged area on dense surfaces, or in the case of porous materials on the surface of the film as well as the internal pore walls with a re-methylating compound called a restoration agent. Restoration agents react with the damaged hydroxylated surfaces to re-alkylate or re-arylate them which in-turn restores the dielectric constant. The following reaction describes an exemplary re-methylation process: SiOH (damaged surface)+RxSi(Cl)y (restoration agent) yields SiOSiRx (repaired surface)+(HCl)y (hydrochloric acid). In the case of porous damaged internal pore wall surfaces, the re-methylation prevents void formation. Many times, the use of a restoration agent allows for conventional etch, ash, and wet cleaning processes to be utilized with low and ultra low dielectric constant materials. The treatment could result in replenishment of carbon to the low-k film, thereby restoring hydrophobicity and resistance to further damage. Additionally, it would be desirable if the repaired low-k material was found to be resistant to void formation, which generally occurs in untreated porous low-k inter-level dielectric regions during copper annealing processes. Re-methylating compounds or silylating agents (which are examples of restoration agents) can methylate the surface of $SiO_2$ based materials. Contemplated exposure includes vapor exposure (with or without plasma), aerosol exposure, spin coating and supercritical $CO_2$. Normally, organosilicate glass (OSG) porous low-k materials are susceptible to void formation in ILD during Cu damascene processing. After treatment with a restoration agent, the resulting structure is significantly more resistant to void formation. Without being bound to any specific theory or mechanism, it is believed that plasma damage causes carbon depletion in the dielectric, by replacing Si—$CH_3$ bonds with Si—OH or SiH bonds depending upon the type of plasmas used, e.g oxidizing and reducing, respectively. In damaged porous dielectrics, the pore surface is now covered with Si—OH bonds. In the presence of tensile stress (such as after Cu annealing), adjacent Si—OH groups can condense, thus causing local densification. The evolving reaction products and the stretching of the molecules due to the new links formed, causes voids to occur near the center of the ILD space. Restoration agents prevent void formation by replacing most Si—OH bonds by Si—O—Si—Rx bonds, which avoid condensation reactions. Therefore void formation does not occur.

Treatment with a restoration agent performed after dielectric trench and via formation using etching, ashing, and wet chemical processes repairs carbon depletion and damage to the low-k materials. By this means, voids are deterred and the low-k materials can withstand internal stresses caused by annealing treatments to the metal filling the trenches and vias.

Treatment with a restoration agent is typically conducted by exposing the wafer surface to the silylating agent in liquid or gas form for a period sufficient to complete the reaction with the damaged low-k region. Optionally, a high temperature bake can be performed to remove remaining solvent and excess restoration agent. Also, optionally, a wet cleaning operation can be performed immediately before the restoration agent application using a material that is chemically compatible with the low-k dielectric material. Additionally a dehydration bake may be performed before the restoration agent treatment to increase effectiveness of the restoration agent.

The effectiveness of the restoration agent can be verified using unpatterned low-k dielectric films subjected to etching and ashing processing followed by treatment with the restoration agent. A successful treatment with a restoration agent results in increased carbon concentration that can be measured by Fourier Infrared Spectroscopy (FTIR), Energy Dispersive X-ray Analysis (EDX), Secondary Ion Mass Spectroscopy (SIMS), or X-ray Photoelectron Spectroscopy (XPS) techniques. Additionally, a water contact angle increase is seen after the application of the restoration agent, which demonstrates the hydrophobic nature of the post-treated surface. The restoration agent treated film also shows a lower dielectric constant extracted from C—V measurements, compared to an etched/ashed film that is not treated with restoration agent. In patterned wafers, the effectiveness of the restoration agent treatment is demonstrated by reduction or elimination of voids in the low-k dielectric in narrow spaces between Cu trenches after a copper anneal treatment following electroplating of copper, and also by lower profile change in trenches or vias after exposure to reactive solvents.

U.S. patent application Publication No. 2006/0057855 A1 to Ramos et al. ("the 855 publication") discloses a "toughening agent" composition for increasing the hydrophobicity of an organosilicate glass dielectric film when applied to said film. According to the 855 publication, the toughening agent includes a component capable of alkylating or arylating silanol moieties of the organosilicate glass dielectric film via silylation, and an activating agent selected from the group consisting of an amine, an onium compound and an alkali metal hydroxide. The 855 publication discloses that the toughening treatment is conducted by exposing the wafer surface to the silylating agent in liquid or gas form for a period sufficient to complete the reaction with the damaged low-k region. The 855 publication further discloses that the toughening treatment can also be conducted in the presence of a plasma derived from, for example, a silane compound, however, no such procedure is exemplified. The use of such plasma in a restoration process, however, is likely to suffer from significant drawbacks.

Plasma chemistry is a useful methodology employed in the manufacture of integrated circuit and other electronic devices to deposit and modify film chemistry for a variety of functions within the layers of dielectric material. Plasmas are employed, for example, to deposit interlayer dielectric materials, barrier materials, and capping materials. Other uses include the modification of surfaces using oxidative or reductive atmospheres to increase the surface roughness or change the chemistry in the surface to increase the adhesion between two films, e.g., metal barriers to interlayer dielectric materials or capping materials to copper lines. For the restoration of low dielectric materials after reactive ion etching (RIE), ashing, and wet cleaning, plasmas may not be the best solution.

Many of the chemistries used to repair dielectric materials will deposit a film under thermal or plasma enhanced CVD processes. Deposition is not necessarily desirable since it may affect the critical dimensions of the feature and may cause issues during packaging due to adhesion and cracking. Similarly, the pore size of many of the dielectric materials ranges from 10-30 Å, therefore small molecules of this dimension are required to insure that the restoration penetrates the damaged portions of the film. Since plasmas are energetic energy sources, there may be gas phase polymerization of the restoration chemistry resulting in molecular sizes greater than the pore size of the dielectric material. These polymerized species will only react at the upper surfaces of the film and not restore the electrical and composition of the entire damaged layer. Two other potential issues with the use of plasmas are: the plasma may cause additional damage to the film due to ion bombardment; and the plasma relies on the ions and other neutral species in the line of site of the features being formed and may minimally interact on the sidewalls of the trenches and vias where it is crucial to repair the damage, i.e., diffusion of plasma generated species may be slow. Plasmas also have the ability to roughen surfaces which may not be desirable for the sidewalls of trenches and vias.

Moreover, with either gas phase or liquid phase restoration processes, a potential exists for leaving residue or chemical species trapped within the dielectric material, particularly during BEOL processing. Although the surfaces of the film are made hydrophobic and the dielectric constant restored by applying silylating chemistries, the silylating species is known to become trapped in the dielectric layer followed by unwanted outgassing during subsequent processing steps, especially those steps that occur at elevated temperatures such as, for example, thermal cycling between temperatures of about 50° C. and about 450° C. Such outgassing causes defects (e.g., pinholes, adhesion, and delamination) created by vapors escaping from the dielectric material during the deposition of metal barriers and capping layers which typically leads to the re-adsorption of water, copper migration into the dielectric layer, and adsorption of other atmospheric contaminants. Each of these issues will cause decreased reliability and modify the performance of the final device. Accordingly, there is a need in the art for a method for restoring dielectric properties of a dielectric material that does not suffer from the above-identified drawbacks.

BRIEF SUMMARY OF THE INVENTION

During BEOL processing of ICs, dielectric material layers on semiconductor substrates are exposed to processes for metalization such as, for example, plasmas and both gas and liquid phase chemistries used to pattern and define features in a dual damascene process. A loss of the layers' dielectric properties and changes in the chemical composition of the dielectric material are typically experienced as a result of the damaged caused by the harsh chemistry and conditions associated with such processes. Such damage may even impact the mechanical strength of the layer. In response to this problem, the present invention is directed to a method for preparing an interlayer dielectric to minimize damage to the interlayer's dielectric constant, the method comprising the steps of: depositing a layer of a silicon-containing dielectric material onto a substrate, wherein the layer has a first dielectric constant and wherein the layer has at least one surface; providing an etched pattern in the layer by a method that includes at least one etch process and exposure to a wet chemical composition to provide an etched layer, wherein the etched layer has a second dielectric constant, and wherein the wet chemical composition contributes from 0 to 40% of the second dielectric constant; contacting the at least one surface of the layer with a silicon-containing fluid; optionally removing a first portion of the silicon-containing fluid such that a second portion of the silicon-containing fluid remains in contact with the at least one surface of the layer; and exposing the at least one surface of the layer to an energy source comprising UV radiation, wherein the layer has a third dielectric constant that is restored to a value that is at least 90% restored relative to the second dielectric constant.

DETAILED DESCRIPTION OF THE INVENTION

The present invention is directed to the preparation of porous low dielectric materials and films such as, for example, those employed as interlayer dielectrics in integrated circuits. In particular, the present invention is directed to a method for preparing an interlayer dielectric to minimize damage to the interlayer's dielectric properties, the method comprising the steps of: depositing a layer of a silicon-containing dielectric material onto a substrate, wherein the layer has a first dielectric constant and wherein the layer has at least one surface; providing an etched pattern in the layer by a method that includes at least one etch process and exposure to a wet chemical composition to provide an etched layer, wherein the etched layer has a second dielectric constant, and wherein the wet chemical composition contributes from 0 to 25% of the second dielectric constant; contacting the at least one surface of the layer with a silicon-containing fluid; optionally removing a first portion of the silicon-containing fluid such that a second portion of the silicon-containing fluid remains in contact with the at least one surface of the layer; and exposing the at least one surface of the layer to an energy source comprising UV radiation, wherein the layer has a third dielectric constant that is restored to a value that is at least 90% restored relative to the second dielectric constant.

The present invention includes the step of depositing a layer of a silicon-containing dielectric material onto a substrate, wherein the layer has a first dielectric constant and wherein the layer has at least one surface. As used herein, the term "a layer" or "the layer" as it refers to the dielectric material means at least a portion of at least one layer of dielectric material whether patterned or not.

In preferred embodiments of the present invention, a layer of silicon-containing dielectric material is disposed on a substrate. Suitable substrates include, but are not limited to, semiconductor materials such as gallium arsenide ("GaAs"), silicon, and compositions containing silicon such as crystalline silicon, polysilicon, amorphous silicon, epitaxial silicon, silicon dioxide ("SiO$_2$"), silicon glass, silicon nitride, fused silica, glass, quartz, borosilicate glass, and combinations thereof. Other suitable materials include chromium, molybdenum, and other metals commonly employed in semi-conductor, integrated circuits, flat panel display, and flexible display applications. The substrate may have additional layers such as, for example, silicon, SiO$_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, boronitride, organic-inorganic composite materials, photoresists, organic polymers, porous organic and inorganic materials and composites, metal oxides such as aluminum oxide, and germanium oxide. Still further layers can also be germanosilicates, aluminosilicates, copper and aluminum, and diffusion barrier materials such as, but not limited to, TiN, Ti(C)N, TaN, Ta(C)N, Ta, W, or WN.

In the method of the present invention, the layer of silicon-containing dielectric material can be formed from the deposition of a film-forming composition comprising a compound or compounds that are capable of forming and maintaining an interconnect network. Examples of silicon-containing dielectric films include, but are not limited to, SiO$_2$, organosilicate glass (OSG), fluorinated silicate glass (FSG), boron carbonitride, silicon carbide, hydrogenated silicon carbide, silicon nitride, hydrogenated silicon nitride, silicon carbonitride, hydrogenated silicon carbonitride, organic-inorganic composite materials, porous organic and inorganic composite materials, borosilicate glass (Si:O:B:H), or phosphorous doped borosilicate glass (Si:O:B:H:P), and combinations thereof.

In preferred embodiments of the present invention, the layer of silicon-containing dielectric material comprises a silica material (i.e., a silica-containing dielectric material). The term "silica", as used herein, is a material that has silicon (Si) and oxygen (O) atoms, and possibly additional substituents such as, but not limited to, other elements such as C, H, B, N, P, or halide atoms; alkyl groups; or aryl groups. In alternative embodiments, the at least one layer of dielectric material may contain, for example, other elements such as, but not limited to, Al, Ti, V, In, Sn, Zn, Ga, and combinations thereof. In certain preferred embodiments, the at least one layer of dielectric material may comprise an organosilicon glass ("OSG") compound represented by the formula Si$_v$O$_w$C$_x$H$_y$F$_z$, where v+w+x+y+z=100 atomic %, v is from 10 to 35 atomic %, w is from 10 to 65 atomic %, x is from 5 to 30 atomic %, y is from 10 to 50 atomic % and z is from 0 to 15 atomic %.

In preferred embodiments of the present invention, the layer of silicon-containing dielectric material is porous, i.e., such layer(s) is/are characterized by the presence of pores. In such embodiments, pores can be formed, for example, when the film-forming composition comprises a silica source and at least one porogen that is capable of being easily and, preferably, substantially removed upon exposure to one or more energy sources. A "porogen" is a reagent that is used to generate void volume within the resultant film. Regardless of whether or not the porogen is unchanged throughout the inventive process, the term "porogen" as used herein is intended to encompass pore-forming reagents (or pore-forming substituents) and derivatives thereof, in whatever forms they are found throughout the entire process described herein. Suitable compounds to be used as the porogen include, but are not limited to, hydrocarbon materials, labile organic groups, solvents, decomposable polymers, surfactants, dendrimers, hyper-branched polymers, polyoxyalkylene compounds, compounds comprising C and H, or combinations thereof. In certain embodiments, the porogen comprises a C$_1$ to C$_{13}$ hydrocarbon compound. Preferred porogens to be employed in a CVD process include, for example, alpha-terpinene, cyclooctane, norbornadiene, cyclooctadiene, bicyclohexadiene, cyclohexene, cyclohexane, limonene, 1,3-butadiene, 1-neohexyl-1,3,5,7-tetramethylcyclotetrasiloxane, 1-neopentyl-1,3,5,7-tetramethylcyclotetrasiloxane, neopentyldiethoxysilane, neohexyldiethoxysilane, neohexyltriethoxysilane, neopentyltriethoxysilane, neopentyl-di-t-butoxysilane, and heteroatomic porogens, such as cyclopentanol, cyclohexene oxide, cyclopentene oxide, cyclohexanone, cyclopentylamine, and mixtures thereof. Preferred porogens to be employed in a spin-on process include, for example, solvents, decomposable polymers, surfactants, dendrimers, hyper-branched polymers, polyoxyalkylene compounds, and mixtures thereof.

In forming pores, the as-deposited material from which the at least one layer of dielectric material is made is typically exposed to one or more energy sources to cure the film and/or remove at least a portion of the porogen contained therein if present. Exemplary energy sources may include, but are not limited to, an ionizing radiation source such as α-particles, β-particles, γ-rays, x-rays, electron beam sources of energy; a nonionizing radiation source such as ultraviolet (10 to 400 nm), visible (400 to 750 nm), infrared (750 to 10$^5$ nm), microwave (>10$^6$), and radio-frequency (>10$^6$) wavelengths of energy; or compositions thereof. Still further energy sources include thermal energy and plasma energy. Depending upon the energy source, the exposure step can be conducted under high pressure, atmospheric, or under a vacuum. The environment can be inert (e.g., nitrogen, $CO_2$, noble gases (He, Ar, Ne, Kr, Xe), etc.), oxidizing (e.g., oxygen, air, dilute oxygen environments, enriched oxygen environments, ozone, nitrous oxide, etc.) or reducing (dilute or concentrated hydrogen, hydrocarbons (saturated, unsaturated, linear or branched, aromatics), amines, ammonia, etc.). The temperature for the exposure step may range from 100 to 500° C. In certain embodiments, the temperature may be ramped at a rate is from 0.1 to 100° C./min. The total treatment time is preferably from 0.01 min to 12 hours.

For example, in embodiments where the pores are formed by photocuring for the removal of the porogen and/or perfecting the lattice structure of the film, such process is conducted under the following conditions: the environment can be inert (e.g., nitrogen, $CO_2$, noble gases (He, Ar, Ne, Kr, Xe), etc.), oxidizing (e.g., $O_2$, $N_2O$) (for certain embodiments), or reducing (e.g., dilute or concentrated hydrocarbons, hydrogen, amines, ammonia, etc.). The temperature is preferably about 25° C. to about 500° C. The wavelengths are preferably infra red (IR), visible, ultraviolet (UV) or deep UV (wavelengths<200 nm). The total curing time is typically anywhere from 0.01 min to 12 hours.

The layer of silicon-containing dielectric material is typically formed as a film onto at least a portion of the substrate (which may include additional layers such as, for example, conductive layers and etch stop barrier layers) from a film-forming composition using a variety of different methods. These methods may be used by themselves or in combination. Some examples of processes that may be used to form the films include the following: thermal chemical vapor deposition, plasma enhanced chemical vapor deposition ("PECVD"), high density PECVD, photon assisted CVD, plasma-photon assisted ("PPECVD"), atomic layer deposition (ALD), cryogenic chemical vapor deposition, chemical assisted vapor deposition, hot-filament chemical vapor deposition, CVD of a liquid polymer precursor, deposition from supercritical fluids, or transport polymerization ("TP"). U.S. Pat. Nos. 6,171,945, 6,054,206, 6,054,379, 6,159,871 and WO 99/41423 provide some exemplary CVD methods that may be used to form the film. Besides chemical vapor deposition processes, other processes that can be used to apply the at least one layer of dielectric material such as, for example, non-contact deposition methods. Non-contact deposition methods typically allow films to be formed without the need of contact masks or shutters. Non-contact deposition methods include, for example, dipping, rolling, brushing, spraying, extrusion, spin-on deposition, air-knife, printing, and combinations thereof. Further exemplary deposition methods include oscillating non-contact induced spreading forces, gravity-induced spreading forces, wetting-induced spreading forces, slot extrusion, and combinations thereof.

The silicon-containing layer of dielectric material according to the present invention has at least one surface. As used herein, the term "surface" includes any gaseous/solid interface, liquid/solid interface, including, for example, pore mouths, pores themselves, interconnectivity of the pores, and porosity within the framework structure. It should be understood, however, that the damage and restoration of the damaged dielectric material according to the present invention can occur at the surfaces and/or within the matrix of the material.

The layer of silicon-containing dielectric material according to the present invention has a first dielectric constant. As used herein, the term "first dielectric constant" refers to the dielectric constant of the layer of silicon-containing dielectric material after it is formed and before it is further processed in the semiconductor manufacturing process such as, for example, in a manner that will damage the dielectric constant. Because the present invention is directed to both porous and dense dielectric layers, if the layer of silicon-containing dielectric material is porous then the first dielectric constant will typically be lower than a dense layer of silicon-containing dielectric material because air is introduced into the dielectric material. Air has a dielectric constant of 1.0, and when air is introduced into a dielectric material in the form of nanoporous or nanometer-scale pore structures, relatively low dielectric constants ("k") are achieved. Preferably, the layer of silicon-containing dielectric material according to the present invention has a first dielectric constant of from about 1.5 to about 3.5, more preferably from about 1.5 to about 2.8, and most preferably from about 1.8 to about 2.7.

The present invention also includes the step of providing an etched pattern in the layer by a method that includes at least one etch process and exposure to a wet chemical composition to provide an etched layer, wherein the etched layer has a second dielectric constant, and wherein the wet chemical composition contributes from 0 to 40% of the second dielectric constant. This step includes a series of processes that shape or alter the existing shape of the deposited materials. Such process includes those known in the art such as, for example, the dual damascene process, which will now be described for purposes of illustration and is not intended to be limiting.

A typical dual damascene trench first approach may be the most damaging of the processes that are employed. In this process, after deposition of the layer of silicon-containing dielectric material a pattern is provided. For example, a photoresist (typically 248 or 193 nm) is applied to the layer of dielectric material, cured, exposed to monochromatic light so as to transfer the mask pattern to the photoresist, and then developed with tetramethylammonium hydroxide (TMAH) based products to remove the material exposed to the light so as to create a pattern in the photoresist. The dielectric material is etched with, for example, a fluorocarbon gas to create a pattern in the dielectric material. The photoresist is then removed using either a dry or wet process, but a common procedure is to use an oxidative plasma based ash process to remove the bulk of the photoresist. Organic, organosilicate, or metal containing residues typically remain after such processes that must be removed. Wet chemical cleaners such as, for example, dilute hydrogen fluoride (HF) or a buffered fluoride system, are typically employed to remove these residues. To create the vias in the trenches, the process of pattern transfer, etching, resist removal, and cleaning are typically repeated. In such processes, trenches typically become filled with photoresist that must also be removed to create the final structure. In some processes, the via is patterned before the trench.

As mentioned above, the above processes employed in providing an etched pattern in a layer of silicon-containing material have been found to damage or remove the carbon from the dielectric material. Such damage typically manifests in the loss of the film's dielectric properties and a change the film's chemical composition. For example, it is well known that damage to organosilicate glass dielectric films during semiconductor manufacturing processes results from the application of plasmas (either remote or in situ) and/or etching reagents to etch trenches and vias into dielectric films and typically causes a reduction in the Si—$CH_3$ species exposed to the process. Plasmas, for example, are used to remove photoresist films during fabrication of semiconductor devices and are typically composed of the elements oxygen, fluorine, hydrogen, carbon, argon, helium or nitrogen (in the form of free atoms, compounds, ions and/or radicals).

Porous low dielectric silicon-containing materials typically suffer more catastrophic effects than dense dielectric films from exposure to reactive etch and ash gases and harsh chemicals due to diffusion through the film, which causes a greater extent of damage throughout the film, because of the increased surface area that is an affectation of porous low-k dielectric materials relative to dense dielectric materials. Without intending to be bound by a particular theory, it is thought that a portion of the silicon-carbon bonds in the silicon-containing material such as, for example, silicon-methyl bonds are broken during such processes and replaced with silicon-hydrogen (Si—H) bonds or silicon-hydroxide (Si—OH) bonds. The Si—H and Si—OH bonds themselves, in addition to having an inherent negative impact on the material's dielectric constant, are also detrimental because they are capable of strongly adsorbing water which leads to an additional undesired increase in the dielectric constant of the material. Thus, for example, a layer of a silicon-containing dielectric material such as, for example, a silica-containing dielectric film that has an organic content (such as methyl groups bonded to Si atoms) is readily degraded when exposed to an oxygen plasma and a silanol (Si—OH) group is typically formed in the material where the organic group formerly resided. Because water has a dielectric constant of about 70, small amounts that are absorbed for dense materials and adsorbed for porous materials cause the dielectric constant to increase. The increase in dielectric constant as a result of damage relative to the first dielectric constant, regardless of whether the material is dense or porous, is herein referred to as the "second dielectric constant". Thus, the value of the second dielectric constant may depend on a number of variables such as, for example, the first dielectric constant of the dielectric material, the chemical nature of the dielectric material, and the harshness of the BEOL process chemistry used to create the trenches and vias. Typically, however, the second dielectric constant is from about 5% to about 200% higher than the value of the first dielectric constant.

The present invention provides a method by which certain material properties of the damaged dielectric material are restored. As used herein, the terms "restore", "repair", "recovery", and "restoration" are used synonomously and refer to an improvement in the material properties of the damaged dielectric material such as, for example, breakdown voltage, leakage current, hydrophobicity, mechanical strength, carbon content, diffusion resistance, adhesion, modification of pore size, and hermeticity. The method of the present invention restores carbon-containing moieties and increases the hydrophobicity of the organosilicate glass low dielectric material. This makes the dielectric material resistant to stresses on the via and trench walls, such as induced by metal shrinkage during annealing, stress from other dielectric layers, and stress during packaging. This also deters undesirable voids from forming inside the dielectric material between the vias and trenches.

The method of the present invention includes the step of contacting the at least one surface of the layer of dielectric material with a silicon-containing fluid to cover the surfaces of, for example, the pores and pore mouths (or the surface of a dense dielectric material). The pores and pore mouths may be covered to seal out liquid and gaseous chemical species from penetrating the pore system or the pores may remain open. As used herein, the term "cover" means that the silica-containing fluid coats the surface and/or wets the surface of the dielectric material. Preferably, as it coats and/or wets the at least one surface, the silicon-containing fluid is at least partially absorbed and/or adsorbed into the dielectric material and/or the surfaces thereof. As used herein, the term "fluid" includes liquids, gases, vapors, aerosols, supercritical fluids, and sublimed solids. The step of contacting the at least one layer with a silicon-containing fluid can occur by methods known to those skilled in the art such as, for example, a gaseous delivery via, for example, a chemical vapor deposition chamber (referred to herein as "CVD") or a liquid delivery such as, for example, by spin-coating. Other methods may also be used to apply the at least one layer of dielectric material such as, for example, dipping, rolling, brushing, spraying, liquid misted deposition, aerosols, extrusion, spin-on deposition, air-knife, printing, and combinations thereof. Further exemplary deposition methods include oscillating non-contact induced spreading forces, gravity-induced spreading forces, wetting-induced spreading forces, slot extrusion, and combinations thereof. For liquid silicon-containing fluids, the preferred contact method is a spin-on process. For gaseous or vaporized liquid silicon-containing fluids, the preferred contact method is by CVD.

The silicon-containing fluids employed according to the present invention include, for example, silica-containing precursors such as, for example, those that are typically employed to form a dielectric material. The type of silicon-containing fluid employed may depend on, for example, the desired method to be employed for the contacting step.

The following silicon-containing fluids are suitable for use in the present invention in either a spin-on deposition process or a CVD process. As such, at least one of the following silicon-containing fluids typically form the composition that will be applied in connection with the contacting step along with optionally a solvent. The solvent, if employed, preferably is a solvent that has a boiling point in the range of from about 50° C. to about 300° C., more preferably in the range of from about 70° C. to about 250° C. Suitable solvents include alcohols, aldehydes, ketones, esters, amides, glycols, glycol ethers, water, ethers, epoxides, amines, and mixtures thereof. Specific examples of solvents include cyclohexanone, 2-hexanone, 2-pentanone, 1-pentanol, 1-butanol, 2-propanol, propylene glycol propyl ether, propylene glycol monomethyl ether acetate, ethyl lactate, pentyl acetate, propylene glycol, propylene glycol monomethyl ether, N,N-dimethylformamide, and mixtures thereof. In embodiments wherein a solvent is employed, the silica-containing fluid comprises preferably from about 0.001 to 99 weight percent, and more preferably from about 0.01 to about 90 weight percent of the total weight of the fluid with the remainder being the solvent and, optionally, additives such as, for example, catalysts, flow aids, wetting agents, pH adjusters, corrosion inhibitors, ionic strength adjusters, and surfactants. Such additives, if present, may function to change the pH of the mixture, aid the silica-containing fluid in wetting and interacting with small features by modifying the surfaces with which the fluid interacts, change the fluid's viscosity, surface tension, and solubility parameters. Such additives may also function to minimize the corrosion of copper, and increase the reactivity of the silicon-containing fluids fluid towards the damage and defects created by BEOL processing.

In the chemical formulas which follow and in all chemical formulas throughout this document, the term "independently" should be understood to denote that the subject R group is not only independently selected relative to other R groups bearing different superscripts, but is also independently selected relative to any additional species of the same R group. For example, in the formula $R_a Si(OR^1)_{4-a}$, when "a"

is 2, the two R groups need not be identical to each other or to R¹. In addition, in the following formulas, the term "monovalent organic group" relates to an organic group bonded to an element of interest, such as Si or O, through a single C bond, i.e., Si—C or O—C. Examples of monovalent organic groups include an alkyl group, an aryl group, an unsaturated alkyl group, and/or an unsaturated alkyl group substituted with alkoxy, ester, acid, carbonyl, or alkyl carbonyl functionality. The alkyl group may be a linear, branched, or cyclic alkyl group having from 1 to 5 carbon atoms such as, for example, a methyl, ethyl, propyl, butyl, or pentyl group. Examples of aryl groups suitable as the monovalent organic group include phenyl, methylphenyl, ethylphenyl and fluorophenyl. In certain embodiments, one or more hydrogens within the alkyl group may be substituted with an additional atom such as a halide atom (i.e., fluorine), or an oxygen atom to give a carbonyl or ether functionality. Examples of (OR¹) can be alkoxy, acetoxy, hydroxyl, siloxanolates, and silanolates.

In certain preferred embodiments, the silicon-containing fluid may be represented by the following formula: $R^aSi(OR^1)_{4-a}$, wherein R independently represents a hydrogen atom, a fluorine atom, or a monovalent organic group; $R^1$ independently represents a monovalent organic group; and a is an integer ranging from 1 to 2. Specific examples of the compounds represented by $R^aSi(OR^1)_{4-a}$ include: methyltrimethoxysilane, methyltriethoxysilane, methyltri-n-propoxysilane, methyltri-iso-propoxysilane, methyltri-n-butoxysilane, methyltri-sec-butoxysilane, methyltri-tert-butoxysilane, methyltriphenoxysilane, ethyltrimethoxysilane, ethyltriethoxysilane, ethyltri-n-propoxysilane, ethyltri-iso-propoxysilane, ethyltri-n-butoxysilane, ethyltri-sec-butoxysilane, ethyltri-tert-butoxysilane, ethyltriphenoxysilane, n-propyltrimethoxysilane, n-propyltriethoxysilane, n-propyltri-n-propoxysilane, n-propyltri-iso-propoxysilane, n-propyltin-n-butoxysilane, n-propyltri-sec-butoxysilane, n-propyltri-tert-butoxysilane, n-propyltriphenoxysilane, isopropyltrimethoxysilane, isopropyltriethoxysilane, isopropyltri-n-propoxysilane, isopropyltriisopropoxysilane, isopropyltri-n-butoxysilane, isopropyltri-sec-butoxysilane, isopropyltri-tert-butoxysilane, isopropyltriphenoxysilane, n-butyltrimethoxysilane, n-butyltriethoxysilane, n-butyltri-n-propoxysilane, n-butyltriisopropoxysilane, n-butyltri-n-butoxysilane, n-butyltri-sec-butoxysilane, n-butyltri-tert-butoxysilane, n-butyltriphenoxysilane; sec-butyltrimethoxysilane, sec-butyltriethoxysilane, sec-butyltri-n-propoxysilane, sec-butyltriisopropoxysilane, sec-butyltri-n-butoxysilane, sec-butyltri-sec-butoxysilane, sec-butyltri-tert-butoxysilane, sec-butyltriphenoxysilane, tert-butyltrimethoxysilane, tert-butyltriethoxysilane, tert-butyltri-n-propoxysilane, tert-butyltriisopropoxysilane, tert-butyltri-n-butoxysilane, tert-butyltri-sec-butoxysilane, tert-butyltri-tert-butoxysilane, tert-butyltriphenoxysilane, isobutyltrimethoxysilane, isobutyltriethoxysilane, isobutyltri-n-propoxysilane, isobutyltriisopropoxysilane, isobutyltri-n-butoxysilane, isobutyltri-sec-butoxysilane, isobutyltri-tert-butoxysilane, isobutyltriphenoxysilane, n-pentyltrimethoxysilane, n-pentyltriethoxysilane, n-pentyltri-n-propoxysilane, n-pentyltriisopropoxysilane, n-pentyltri-n-butoxysilane, n-pentyltri-sec-butoxysilane, n-pentyltri-tert-butoxysilane, n-pentyltriphenoxysilane; sec-pentyltrimethoxysilane, sec-pentyltriethoxysilane, sec-pentyltri-n-propoxysilane, sec-pentyltriisopropoxysilane, sec-pentyltri-n-butoxysilane, sec-pentyltri-sec-butoxysilane, sec-pentyltri-tert-butoxysilane, sec-pentyltriphenoxysilane, tert-pentyltrimethoxysilane, tert-pentyltriethoxysilane, tert-pentyltri-n-propoxysilane, tert-pentyltriisopropoxysilane, tert-pentyltri-n-butoxysilane, tert-pentyltri-sec-butoxysilane, tert-pentyltri-tert-butoxysilane, tert-pentyltriphenoxysilane, isopentyltrimethoxysilane, isopentyltriethoxysilane, isopentyltri-n-propoxysilane, isopentyltriisopropoxysilane, isopentyltri-n-butoxysilane, isopentyltri-sec-butoxysilane, isopentyltri-tert-butoxysilane, isopentyltriphenoxysilane, neo-pentyltrimethoxysilane, neo-pentyltriethoxysilane, neo-pentyltri-n-propoxysilane, neo-pentyltriisopropoxysilane, neo-pentyltri-n-butoxysilane, neo-pentyltri-sec-butoxysilane, neo-pentyltri-neo-butoxysilane, neo-pentyltriphenoxysilane phenyltrimethoxysilane, phenyltriethoxysilane, phenyltri-n-propoxysilane, phenyltriisopropoxysilane, phenyltri-n-butoxysilane, phenyltri-sec-butoxysilane, phenyltri-tert-butoxysilane, phenyltriphenoxysilane, δtrifluoropropyltrimethoxysilane, δ-trifluoropropyltriethoxysilane, dimethyldimethoxysilane, dimethyldiethoxysilane, dimethyldi-n-propoxysilane, dimethyldiisopropoxysilane, dimethyldi-n-butoxysilane, dimethyldi-sec-butoxysilane, dimethyldi-tert-butoxysilane, dimethyldiphenoxysilane, diethyldimethoxysilane, diethyldiethoxysilane, diethyldi-n-propoxysilane, diethyldiisopropoxysilane, diethyldi-n-butoxysilane, diethyldi-sec-butoxysilane, diethyldi-tert-butoxysilane, diethyldiphenoxysilane, di-n-propyldimethoxysilane, di-n-propyldimethoxysilane, di-n-propyldi-n-propoxysilane, di-n-propyldiisopropoxysilane, di-n-propyldi-n-butoxysilane, di-n-propyldi-sec-butoxysilane, di-n-propyldi-tert-butoxysilane, di-n-propyldiphenoxysilane, diisopropyldimethoxysilane, diisopropyldiethoxysilane, diisopropyldi-n-propoxysilane, diisopropyldiisopropoxysilane, diisopropyldi-n-butoxysilane, diisopropyldi-sec-butoxysilane, diisopropyldi-tert-butoxysilane, diisopropyldiphenoxysilane, di-n-butyldimethoxysilane, di-n-butyldiethoxysilane, di-n-butyldi-n-propoxysilane, di-n-butyldiisopropoxysilane, di-n-butyldi-n-butoxysilane, di-n-butyldi-sec-butoxysilane, di-n-butyldi-tert-butoxysilane, di-n-butyldiphenoxysilane, di-sec-butyldimethoxysilane, di-sec-butyldiethoxysilane, di-sec-butyldi-n-propoxysilane, di-sec-butyldiisopropoxysilane, di-sec-butyldi-n-butoxysilane, di-sec-butyldi-sec-butoxysilane, di-sec-butyldi-tert-butoxysilane, di-sec-butyldiphenoxysilane, di-tert-butyldimethoxysilane, di-tert-butyldiethoxysilane, di-tert-butyldi-n-propoxysilane, di-tert-butyldiisopropoxysilane, di-tert-butyldi-n-butoxysilane, di-tert-butyldi-sec-butoxysilane, di-tert-butyldi-tert-butoxysilane, di-tert-butyldiphenoxysilane, diphenyldimethoxysilane, diphenyldiethoxysilane, diphenyldi-n-propoxysilane, diphenyldiisopropoxysilane, diphenyldi-n-butoxysilane, diphenyldi-sec-butoxysilane, diphenyldi-tert-butoxysilane, diphenyldiphenoxysilane, methylneopentyldimethoxysilane, methylneopentyldiethoxysilane, methyldimethoxysilane, ethyldimethoxysilane, n-propyldimethoxysilane, isopropyldimethoxysilane, n-butyldimethoxysilane, sec-butyldimethoxysilane, tert-butyldimethoxysilane, isobutyldimethoxysilane, n-pentyldimethoxysilane, sec-pentyldimethoxysilane, tert-pentyldimethoxysilane, isopentyldimethoxysilane, neopentyldimethoxysilane, neohexyldimethoxysilane, cyclohexyldimethoxysilane, phenyldimethoxysilane, diethoxymethylsilane, ethyldiethoxysilane, n-propyldiethoxysilane, isopropyldiethoxysilane, n-butyldiethoxysilane, sec-butyldiethoxysilane, tert-butyldiethoxysilane, isobutyldiethoxysilane, n-pentyldiethoxysilane, sec-pentyldiethoxysilane, tert-pentyldiethoxysilane, isopentyldiethoxysilane, neopentyldiethoxysilane, neohexyldiethoxysilane, cyclohexyldiethoxysilane, phenyldiethoxysilane, trimethoxysilane, triethoxysilane, tri-n-propoxysilane, triisopropoxysilane, tri-n-butoxysilane, tri-sec-butoxysilane, tri-tert-butoxysilane, triphenoxysilane, allyltrimethoxysilane, allyltriethoxysilane, vinyltrimethoxsilane, vinyltriethoxysilane, (3-acryloxypropyl)trimethoxysilane, allyltrimethoxysilane, allyltriethoxysilane, vinyltrimethoxsilane, vinyltriethoxysilane, and (3-acryloxypropyl) trimethoxysilane. Of the above compounds, the preferred compounds are methyltrimethoxysilane, methyltriethoxysilane, methyltri-n-propoxysilane, methyltriisopropoxysilane, ethyltrimethoxysilane, ethyltriethoxysilane, dimethyldimethoxysilane, dimethyldiethoxysilane, diethoxymethylsilane, diethyldimethoxysilane, and diethyldiethoxysilane.

The silicon-containing fluid may also be a compound having the formula $Si(OR^2)_4$ wherein $R^2$ independently represents a monovalent organic group. Specific examples of the compounds represented by $Si(OR^2)_4$ include tetramethoxysilane, tetraethoxysilane, tetra-n-propoxysilane, tetraisopropoxysilane, tetra-n-butoxysilane, tetra-sec-butoxysilane, tetra-tert-butoxysilane, tetraacetoxysilane, and tetraphenoxysilane. Of the above, certain preferred compounds may include tetramethoxysilane, tetraethoxysilane, tetra-n-propoxysilane, tetraisopropoxysilane, or tetraphenoxysilane.

The silicon-containing fluid may also be a compound having the formula $R^3{}_b(R^4O)_{3-b}Si\text{---}(R^7)\text{---}Si(OR^5)_{3-c}R^6{}_c$, wherein $R^3$ and $R^6$ are independently a hydrogen atom, a fluorine atom, or a monovalent organic group; $R^4$ and $R^5$ are independently a monovalent organic group; b and c may be the same or different and each is a number ranging from 0 to 2; $R^7$ is an oxygen atom, a phenylene group, a biphenyl, a naphthalene group, or a group represented by $\text{---}(CH_2)_n\text{---}$, wherein n is an integer ranging from 1 to 6; or combinations thereof. Specific examples of these compounds wherein $R^7$ is an oxygen atom include: hexamethoxydisiloxane, hexaethoxydisiloxane, hexaphenoxydisiloxane, 1,1,1,3,3-pentamethoxy-3-methyldisiloxane, 1,1,1,3,3-pentaethoxy-3-methyldisiloxane, 1,1,1,3,3-pentamethoxy-3-phenyldisiloxane, 1,1,1,3,3-pentaethoxy-3-phenyldisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,1,3,3-tetraethoxy-1,3-diphenyldisiloxane, 1,1,3-trimethoxy-1,3,3-trimethyldisiloxane, 1,1,3-triethoxy-1,3,3-trimethyldisiloxane, 1,1,3-trimethoxy-1,3,3-triphenyldisiloxane, 1,1,3-triethoxy-1,3,3-triphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane and 1,3-diethoxy-1,1,3,3-tetraphenyldisiloxane. Of those, preferred compounds are hexamethoxydisiloxane, hexaethoxydisiloxane, hexaphenoxydisiloxane, 1,1,3,3-tetramethoxy-1,3-dimethyldisiloxane, 1,1,3,3-tetraethoxy-1,3-dimethyldisiloxane, 1,1,3,3-tetramethoxy-1,3-diphenyldisiloxane, 1,3-dimethoxy-1,1,3,3-tetramethyldisiloxane, 1,3-diethoxy-1,1,3,3-tetramethyldisiloxane, 1,3-dimethoxy-1,1,3,3-tetraphenyldisiloxane; and 1,3-diethoxy-1,1,3,3-tetraphenyldisiloxane. Specific examples of these compounds wherein $R^7$ is a group represented by $\text{---}(CH_2)_n\text{---}$ include: bis(trimethoxysilyl)methane, bis(triethoxysilyl)methane, bis(triphenoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, bis(ethoxydiphenylsilyl)methane, 1,2-bis(trimethoxysilyl)ethane, 1,2-bis(triethoxysilyl)ethane, 1,2-bis(triphenoxysilyl)ethane, 1,2-bis(dimethoxymethylsilyl)ethane, 1,2-bis(diethoxymethylsilyl)ethane, 1,2-bis(dimethoxyphenylsilyl)ethane, 1,2-bis(diethoxyphenylsilyl)ethane, 1,2-bis(methoxydimethylsilyl)ethane, 1,2-bis(ethoxydimethylsilyl)ethane, 1,2-bis(methoxydiphenylsilyl)ethane, 1,2-bis(ethoxydiphenylsilyl)ethane, 1,3-bis(trimethoxysilyl)propane, 1,3-bis(triethoxysilyl)propane, 1,3-bis(triphenoxysilyl)propane, 1,3-bis(dimethoxymethylsilyl)propane, 1,3-bis(diethoxymethylsilyl)propane, 1,3-bis(dimethoxyphenylsilyl)propane, 1,3-bis(diethoxyphenylsilyl)propane, 1,3-bis(methoxydimethylsilyl)propane, 1,3-bis(ethoxydimethylsilyl)propane, 1,3-bis(methoxydiphenylsilyl)propane, and 1,3-bis(ethoxydiphenylsilyl) propane. Of those, preferred compounds are bis(trimethoxysilyl)methane, bis(triethoxysilyl)methane, bis(dimethoxymethylsilyl)methane, bis(diethoxymethylsilyl)methane, bis(dimethoxyphenylsilyl)methane, bis(diethoxyphenylsilyl)methane, bis(methoxydimethylsilyl)methane, bis(ethoxydimethylsilyl)methane, bis(methoxydiphenylsilyl)methane, and bis(ethoxydiphenylsilyl)methane.

In certain preferred embodiments of the present invention, $R^1$ of the formula $R_aSi(OR^1)_{4-a}$; $R^2$ of the formula $Si(OR^2)_4$; and $R^4$ and/or $R^5$ of the formula $R^{3b}(R^4O)_{3-b}Si\text{---}(R^7)\text{---}Si(OR^5)_{3-c}R^6{}_c$ can each independently be a monovalent organic group of the formula:

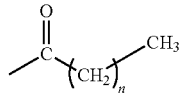

wherein n is an integer from 0 to 4. Specific examples of these compounds include: tetraacetoxysilane, methyltriacetoxysilane, ethyltriacetoxysilane, n-propyltriacetoxysilane, isopropyltriacetoxysilane, n-butyltriacetoxysilane, sec-butyltriacetoxysilane, tert-butyltriacetoxysilane, isobutyltriacetoxysilane, n-pentyltriacetoxysilane, sec-pentyltriacetoxysilane, tert-pentyltriacetoxysilane, isopentyltriacetoxysilane, neopentyltriacetoxysilane, phenyltriacetoxysilane, dimethyldiacetoxysilane, diethyldiacetoxysilane, di-n-propyldiacetoxysilane, diisopropyldiacetoxysilane, di-n-butyldiacetoxysilane, di-sec-butyldiacetoxysilane, di-tert-butyldiacetoxysilane, diphenyldiacetoxysilane, triacetoxysilane. Of these compounds, dimethyldiacetoxysilane, trimethylacetoxysilane, and methyltriacetoxysilane are preferred.

In other embodiments of the present invention, the silicon-containing fluid may preferably have an at least one carboxylic acid ester bonded to the Si atom. Examples of these silica sources include methyltriacetoxysilane, ethyltriacetoxysilane, and phenyltriacetoxysilane. In addition to the at least one silicon-containing fluid wherein the silicon-containing fluid has at least one Si atom having a carboxylate group attached thereto, the composition may further comprise additional silicon-containing fluids that may not necessarily have the carboxylate attached to the Si atom.

In yet another embodiment the silicon-containing fluid is a silazane such as, for example, hexamethydisilazane, heptamethyldisialzane, and hexamethycyclotrisilazane. In yet another embodiment the silicon-containing fluid is an amino silane such as, for example, dimethylaminosilane, dimethylaminotrimethylsilane, aminopropyldimethylethoxysilane, and bis(dimethylamino)dimethylsilane. In yet another embodiment the silicon-containing fluid is a cyclic siloxane such as, for example, tetramethylcyclotetrasiloxane (TMCTS), and octamethylcyclotetrasiloxane (OMCTS), hexamethylcyclotrisiloxane, decamethylcyclopentasilane, dodecamethylcyclohexasilane. In still yet another embodiment, the silicon-containing fluid is a carbosilane such as, for example, 1,methyl-1-ethoxy-silacyclopentane, 2,2,4,6,6-pentamethyl-2,4,6-trisila-heptane, 1,1,3,3-tetramethyl-1,3-disilacyclobutane, and 1,3-dimethyl-1,3-diethoxy-1,3-disilacyclobutane.

The silicon-containing fluid may contain constituents that improve the adhesion of the next layer that will be deposited. For example: if a molecule such as $(RO)_3Si-Co(CO)_4$ were used for repair, one might leave behind a cobalt carbonyl bound to the surface of the dielectric. UV cure in this case would be expected to activate the cobalt complex with elimination of CO and the formation of a glue layer for the diffusion barrier. A number of metals could be incorporated in this type of fashion, one could also just have a good metal ligand on the silicon such that it would be an anchor for an incoming metal species in the subsequent barrier seed process. This chemistry might be best done from a solution phase reagent to give more flexibility on the organometallic on organic reagents used. A couple of other possibilities might be $((OR)_3Si-Cp)_2TaH_3$ $((OR)_3Si)_2W(CO)_4$ or even a disilane such as $(OR)_6Si_2$. There are many possibilities, but silicon-containing fluid could help to manage the interface of the next layer in addition to repairing the dielectric material.

In certain other embodiments of the present invention the silicon-containing fluid may contain other additives to change the wetting characteristics of the fluid. The wetting characteristics of the fluid, may aid the ability of the silicon-containing fluid to penetrate small patterned features or help to eliminate any rinse necessary to partially remove the silicon-containing fluid or any of its by-products. These additives may include, but are not limited to, compounds having fluorinated groups such as perfluorinated alkyls; silicones and polydimethylsiloxanes, such as polyether modified polydimethylsiloxanes; commercially available flow additives, such as BYKCHEMIE™ 307, 331, and 333 (available from BYK-Chemie GmbH, Abelstrase 45, 46483 Wesel, Germany); silicones; polyacrylates; and paraffinic distillates; surfactants; decomposable polymers; dendrimers; hyper-branched polymers; polyoxyalkylene compounds; organic macromolecules; or combinations thereof. In many cases, these additives change the surface tension, solubility parameters, and/or the viscosity of the fluid thereby allowing the silicon-containing fluid to better cover the surfaces and patterns in the film.

In embodiments of the present invention wherein a CVD process is employed in connection with the contacting step, gaseous reagents are preferred. Although the phrase "gaseous reagents" is sometimes used herein to describe the reagents, the phrase is intended to encompass reagents delivered directly as a gas to the reactor, delivered as a vaporized liquid, a sublimed solid and/or transported by an inert carrier gas into the reactor. In such process, gaseous reagents typically flow into a reaction chamber such as, for example, a vacuum chamber, and an equilibrium is allowed to be reached between the gaseous reagents (i.e., fluid) and the material. Optionally, this can be followed by evacuation of the gaseous reagents and/or solvent rinsing or otherwise removing excess fluid. Flow rates for each of the gaseous reagents may range from 10 to 5000 standard cubic centimeters per minute (sccm). Pressure values in the vacuum chamber during the contact step may range from 0.01 to 600 torr, more preferably 1 to 50 torr. In certain embodiments, the deposition is conducted at a temperature ranging from 25 to 425° C., or from 100 to 425° C., or from 150 to 300° C. It is understood however that process parameters such as flow rate, pressure, and temperature may vary depending upon numerous factors such as the surface area of the substrate, the precursors employed, and the equipment employed in the process.

In one embodiment of the CVD process wherein the at least one layer of silicon-containing dielectric material is porous and comprises Si, C, O, H, and F, the contacting step is performed by providing a substrate comprising the at least one layer of porous dielectric material within a vacuum chamber; introducing into the vacuum chamber gaseous reagents that comprises at least one silicon-containing fluid selected from the group consisting of an organosilane and an organosiloxane; allowing equilibrium to be reached between the at least one silicon-containing fluid and the material; and removing the excess of the at least one silicon-containing fluid.

Silicon-containing fluids such as organosilanes and organosiloxanes are preferred in the chemical vapor deposition contacting step. Suitable organosilanes and organosiloxanes include, e.g.: (a) alkylsilanes represented by the formula $R^{11}{}_nSiR^{12}{}_{4-n}$, where n is an integer from 1 to 3; $R^{11}$ and $R^{12}$ are independently at least one branched or straight chain $C_1$ to $C_8$ alkyl group (e.g., methyl, ethyl), a $C_3$ to $C_8$ substituted or unsubstituted cycloalkyl group (e.g., cyclobutyl, cyclohexyl), a $C_3$ to $C_{10}$ partially unsaturated alkyl group (e.g., propenyl, butadienyl), a $C_6$ to $C_{12}$ substituted or unsubstituted aromatic (e.g., phenyl, tolyl), a corresponding linear, branched, cyclic, partially unsaturated alkyl, or aromatic containing alkoxy group (e.g., methoxy, ethoxy, phenoxy), and $R^2$ is alternatively hydride (e.g., methylsilane, dimethylsilane, trimethylsilane, tetramethylsilane, phenylsilane, methylphenylsilane, cyclohexylsilane, tert-butylsilane, ethylsilane, diethylsilane, tetraethoxysilane, dimethyldiethoxysilane, dimethyldimethoxysilane, dimethylethoxysilane, methyldiethoxysilane, triethoxysilane, trimethylphenoxysilane and phenoxysilane); (b) a linear organosiloxane represented by the formula $R^{11}(R^{12}{}_2SiO)_nSiR^{12}{}_3$ where n is an integer from 1 to 10, or cyclic organosiloxane represented by the formula $(R^1R^2SiO)_n$ where n is an integer from 2 to 10 and $R^{11}$ and $R^{12}$ are as defined above (e.g., 1,3,5,7-tetramethylcyclotetrasiloxane, octamethylcyclotetrasiloxane, hexamethylcyclotrisiloxane, hexamethyldisiloxane, 1,1,2,2-tetramethyldisiloxane, and octamethyltrisiloxane); and (c) a linear organosilane oligomer represented by the formula $R^{12}(SiR^{11}R^{12})_nR^{12}$ where n is an integer from 2 to 10, or cyclic organosilane represented by the formula $(SiR^1R^2)_n$, where n is an integer from 3 to 10, and $R^{11}$ and $R^{12}$ are as defined above (e.g., 1,2-dimethyldisilane, 1,1,2,2-tetramethyldisilane, 1,2-dimethyl-1,1,2,2-dimethoxydisilane, hexamethyldisilane, octamethyltrisilane, 1,2,3,4,5,6-hexaphenylhexasilane, 1,2-dimethyl-1,2-diphenyldisilane and 1,2-diphenyldisilane). In certain embodiments, the organosilane/organosiloxane is a cyclic alkylsilane, a cyclic alkoxysilane or contains at least one alkoxy or alkyl bridge between a pair of Si atoms, such as 1,2-disilanoethane, 1,3-disilanopropane, dimethylsilacyclobutane, 1,2-bis(trimethylsiloxy)cyclobutene, 1,1-dimethyl-1-sila-2,6-dioxacyclohexane, 1,1-dimethyl-1-sila-2-oxacyclohexane, 1,2-bis(trimethylsiloxy)ethane, 1,4-bis(dimethylsilyl)benzene or 1,3-(dimethylsilyl)cyclobutane. In certain embodiments, the organosilane/organosiloxane contains a reactive side group selected from the group consisting of an epoxide, a carboxylate, an alkyne, a diene, phenyl ethynyl, a strained cyclic group and a $C_4$ to $C_{10}$ group which can sterically hinder or strain the organosilane/organosiloxane, such as trimethylsilylacetylene, 1-(trimethylsilyl)-1,3-butadiene, trimethylsilylcyclopentadiene, trimethylsilylacetate, di-tert-butoxydiacetoxysilane, methyltriacetoxysilane, dimethyldiacetoxysilane, and methyltriethoxysilane.

In other preferred embodiments of the present invention, the silicon-containing fluid can comprise a fluorine-providing silica precursor gas. Preferred fluorine-providing precursor gases for a CVD-deposited film comprise F—C bonds (i.e., fluorine bonded to carbon). Exemplary fluorine-providing gases include, e.g., organofluorosilanes such as, for example, alkylsilanes, alkoxysilanes, linear and cyclic organosiloxanes, linear and cyclic organosilane oligomers, cyclic or bridged organosilanes, and organosilanes with reactive side groups, provided that a fluorine atom is substituted for at least one of the species covalently bonded to silicon such that there is at least one Si—F bond. More specifically, suitable fluorine-providing gases include, e.g., fluorotrimethylsilane, difluorodimethylsilane, methyltrifluorosilane, fluorotriethoxysilane, 1,2-difluoro-1,1,2,2,-tetramethyldisilane, or difluorodimethoxysilane.

The duration of the contacting step can vary depending on the time required to achieve equilibrium between the at least one silicon-containing fluid and the surfaces of the material. For spin-on processes, the duration of the contact step is preferably from 5 seconds to 30 minutes, and more preferably from 5 seconds to 300 seconds. For CVD methods, the duration of the contact step is preferably from 5 seconds to 4 hours, and more preferably from 5 seconds to 1 hour.

The method of the present invention optionally includes the step of removing a first portion of the silicon-containing fluid such that a second portion of the silicon-containing fluid remains in contact with the at least one surface of the layer of silicon-containing dielectric material. As used herein, the phrase "a first portion of the silicon-containing fluid such that a second portion of the silicon-containing fluid remains in contact with the at least one surface of the layer of silicon-containing dielectric material" as it refers to the removing step of the present invention means that the bulk of the silicon-containing fluid (i.e., the first portion) is removed from the surface of the film (i.e., the layer of dielectric material), including the trenches and vias; however, the removal of the silicon-containing fluid is not complete such that an amount of silicon-containing fluid (i.e., the second portion) remains absorbed and/or adsorbed or otherwise remains in contact with the layer of dielectric material such that an organosilane moiety such as, for example, a methyl group bonded to silicon, can react with or replace a hydroxyl group bound to a silicon atom upon exposure to an energy source according to the present invention. Excess material will undesirably lead to an additional layer of film formation upon exposure to such energy source. The removing step can be performed by any means known to those of ordinary skill in the art and will depend upon the method employed for the contacting step. For example, if the silicon-containing fluid is gaseous and the contacting step is by a CVD method, the chamber, which is typically equipped with one or more valves, can be exhausted. If, for example, the silicon-containing fluid is liquid and the contacting step is by a spin-on method, the excess fluid can be spun-off and the film dried. This could also mean using a rinse solvent, using super critical fluids, heat, evaporative techniques.

At a point after the layer of silicon-containing dielectric material is contacted with the silicon-containing fluid, the method of the present invention includes the step of exposing the at least one surface of the layer of silicon-containing dielectric material to an energy source, wherein the layer of silicon-containing dielectric material has a third dielectric constant that is lower than the second dielectric constant after exposing the layer of silicon-containing dielectric material to the energy source. The third dielectric constant may be between the first and second dielectric constant, equivalent to the first dielectric constant or lower than the first dielectric constant. Without intending to be bound by a particular theory, it is believed that the exposing step activates the fluid and/or the dielectric material to induce a chemical reaction to replace the hydroxyl groups bound to silicon atoms with hydrophobic carbon-containing groups such as, for example, methyl groups covalently bonded to silicon, which leads to the stability of the restoration process. Suitable energy sources include is at least one selected from the group consisting of $\alpha$-particles, $\beta$-particles, $\gamma$-rays, x-rays, high energy electron, electron beam ("e-beam"), ultraviolet (UV) radiation (wavelengths from 10 nm to 400 nm), visible light (wavelengths from 400 to 750 nm), heat, hot filament, infrared light (wavelengths from 750 to $10^5$ nm), microwave (frequency>$10^9$ Hz), radio-frequency wavelengths (frequency>$10^6$ Hz), sonic or ultrasonic frequencies, or mixtures thereof. In addition to energy sources, the restoration chemistry may be activated chemically. This may be accomplished by either reacting the dielectric material prior to or after the exposure to the silicon-containing fluid. The chemical activation may be a reaction of the surface with a base followed by the repair with an acidic silicon-containing fluid. The other possibility is to have a material, such as a photoactive material, that will liberate an acid or base during the exposing step. The acid or base that is released will react with the surface and/or the silicon-containing fluid to catalyze the condensation reactions. Preferably, the energy source employed in the exposing step is selected from the group consisting of: UV radiation, heat, and an electron beam, and mixtures thereof. UV radiation alone and UV radiation in combination with heat are the most preferred energy sources.

When the energy source is UV radiation, the temperature of the substrate (and the at least one layer of dielectric material) is preferably from about 25° C. to about 500° C., more preferably from about 25° C. to about 425° C., and still more preferably from about 100° C. to about 400° C. The layer of silicon-containing dielectric material whose at least on surface is in contact with the silicon-containing fluid may be exposed to one or more wavelengths within the ultraviolet spectrum or one or more wavelengths within the ultraviolet spectrum such as deep ultraviolet light (i.e., wavelengths of 280 nm or below) or vacuum ultraviolet radiation (i.e., wavelengths of 200 nm or below). The ultraviolet radiation may be dispersive, focused, continuous wave, pulsed, scanning, or shuttered. Sources for the ultraviolet radiation include, but are not limited to, broad band sources (500 to 150 nm), dual frequency sources, e.g. combination of two monochromatic sources, an excimer laser, $CO_2$ laser, a barrier discharge lamp, a mercury lamp, a microwave-generated UV lamp, a laser such as a frequency doubled or frequency tripled laser in the IR or visible region, or a two-photon absorption from a laser in the visible region.

In certain embodiments, the ultraviolet radiation source is passed through optics to control the environment to which the sample is exposed. By controlling the environment in the chamber, the temperature of the substrate can be kept relatively low during the exposing step by adjusting the ultraviolet light to a particular wavelength.

In preferred embodiments, the exposure step is conducted in a non-oxidizing atmosphere such as an inert atmosphere (e.g., nitrogen, helium, argon, etc.), a reducing atmosphere (e.g., $H_2$, CO), or vacuum. Specific temperature and time durations for the exposure step may vary depending upon the chemical species used to restore the film's dielectric constant. The exposure step can be conducted for a time of about 60 minutes or less, preferably about 10 minutes or less, and more preferably for about 1 minute or less. The exposing step can occur in the same vessel/apparatus as the contacting step or a different vessel.

In preferred embodiments of the present invention, carbon is re-introduced into the film on the at least one surface as $CH_3$—Si, rather than as C—C from an organic source (although a C—C bond may be present in small amounts relative to the $CH_3$—Si bonds). Accordingly, the amount of carbon is higher after the method of the present invention relative to the amount of carbon in the damaged films (i.e., films having the second dielectric constant) and the dielectric layers preferably exhibit a stable dielectric constant after the process of the present invention. In addition to stable electrical properties, the mechanical properties of the film may be enhanced after the film has been covered with the silicon-containing fluid and the exposing step completed. The modulus of the film may increase between 10 and 200%.

The above-described restoration chemistry and process is disclosed in U.S. patent application Ser. No. 12/023,552, filed Jan. 31, 2008, the disclosure of which is incorporated herein by reference in its entirety.

Heretofore, it was known in the prior art that wet chemical cleaners/strippers contributed to removal of the carbon from the silicon-containing layer of dielectric material, which manifested in the loss of the film's dielectric properties (i.e., contributed to the value of the second dielectric constant of the layer) and a change the film's chemical composition. The present inventors have found surprisingly that when the above-described restoration process is employed in conjunction with a certain wet chemical employed in the process for providing an etched pattern as described and exemplified above, the dielectric performance (e.g., the dielectric constant) of the repaired film is improved over that of a repaired film that has not been processed with a wet chemical composition according to the present invention. As used herein, the phrase "in conjunction with" as it related to the above-described restoration chemistry and the wet chemical compositions according to the present invention, refers to the cooperative effect of the combination on the ultimate result of the restoration process. For example, according to the present invention, wet chemical compositions according to the present invention can be employed as cleaners/strippers during the process of providing an etched pattern followed later in time by the above-described restoration process in which a silicon-containing fluid is applied on a damaged wafer followed by exposure to UV radiation. Alternatively, the wet chemical compositions according to the present invention can be applied to the damaged wafer at the same time as the silicon-containing fluid either as a separate composition or as a mixture with the silicon-containing fluid.

The inventors have found that when a wet chemical composition according to the present invention is employed as, for example, a cleaner/stripper, the wet chemical composition contributes from 0 to 40% of the second dielectric constant such that, after the restoration process, the third dielectric constant is restored to a value that is at least 90% restored relative to the second dielectric constant. Thus, for example, if the first dielectric constant of a silicon-containing dielectric material is 2.5 and the second dielectric constant increases to 3.0 after an etched pattern is provided wherein the layer was cleaned with a wet chemical composition according to the present invention at some point during the process of providing the etched pattern, the wet chemical composition according to the present invention will have contributed to no more than 0.125 (25% of 0.5 increase) to the value of the second dielectric constant.

Preferably, the wet chemical composition according to the present invention contributes from 0 to 25% of the second dielectric constant. More preferably, the wet chemical composition according to the present invention contributes from 0 to 15% of the second dielectric constant. Still more preferably, the wet chemical composition according to the present invention contributes from 0 to 10% of the second dielectric constant.

Wet chemical compositions according to the present invention include the following compositions.

Composition A

One composition according to the present invention that has displayed a synergism with the restoration chemistry described above is a wet chemical composition comprising a fluoride ion source; a pH buffer system comprising a polyprotic acid having at least three carboxylic acid groups and its conjugate base; a solvent having at least one polyhydric alcohol; and water. In preferred embodiments, the wet chemical composition consists essentially of from about 20 to about 99 weight percent glycerol; from about 30 to about 90 weight percent water, deionized (DI); from about 0.1 to about 10 weight percent of a 29% solution of citric acid or stoichiometric equivalent thereof; from about 0.1 to about 40 weight percent of a 50% solution of ammonium citrate tribasic or stoichiometric equivalent thereof; and from about 0.1 to about 10 weight percent of a 40% solution of ammonium fluoride or stoichiometric equivalent thereof. In more preferred embodiments, the wet chemical composition consists essentially of from about 25 to about 50 weight percent glycerol; from about 40 to about 70 weight percent water (DI); from about 0.5 to about 1.5 weight percent of a 29% solution of citric acid; from about 3 to about 7 weight percent of a 50% solution of ammonium citrate tribasic; and from about 1 to about 5 weight percent of 40% solution of ammonium fluoride. Compositions of this type are disclosed in U.S. patent application Publication No. 11/652,407, which is incorporated herein by reference in its entirety.

Composition B

Another wet chemical composition according to the present invention comprises water (DI); acetic acid; propylene glycol; dipropylene glycol monomethyl ether; and ammonium fluoride. In preferred embodiments, the wet chemical composition consists essentially of from about 50 to about 99 weight percent of water; from about 1 to about 2.0 weight percent of a glacial acetic acid solution; from about 0.5 to about 20 weight percent of propylene glycol; from about 0.5 to about 20 weight percent of dipropylene glycol monomethyl ether; and from about 0.01 to about 0.5 weight percent of a 40% solution of ammonium fluoride. In embodiments more preferred, the wet chemical composition consists essentially of from about 70 to about 99 weight percent of water; from about 0.2 to about 1.0 weight percent of a glacial acetic acid solution; from about 1.0 to about 10 weight percent of propylene glycol; from about 1.0 to about 10 weight percent of dipropylene glycol monomethyl ether; and from about 0.05 to about 0.3 weight percent of a 40% solution of ammonium fluoride.

Preferably, the combination of the wet chemical compositions and the restoration chemistry according to the present invention is compatible with materials employed in the manufacture of microelectronics such as, for example, copper; dielectric materials such as low k, OSG, SiCOH, CDO, FSG, $SiO_2$; electromigration mitigation layers/materials such as, for example, CoWP, CoSnP, CoP, CoB, CoSnB, CoWB, In, Pd, CuSiN, CuGeN, or metals such as, for example, Sn, Zn, and Cr; and silicon-based materials such as, for example, $SiO_x$, $Si_xN_y$, SiCN, SiCO, SiC, and SiCNO.

According to the present invention, after the contacting and exposing steps—and in conjunction with the employment of wet chemical compositions according to the present invention—the layer of silicon-containing dielectric material will have a third dielectric constant that is restored to a value that is at least 90% restored relative to the second dielectric constant. Preferably, the third dielectric constant is restored to a value that is anywhere from about 90% to about 150% restored relative to the second dielectric constant. As used herein, the phrase "restored" or "% restored" as it refers to the third dielectric constant refers to a value calculated by the following equation:

$$\% \text{ restored} = [(\text{second dielectric constant} - \text{third dielectric constant})/(\text{second dielectric constant} - \text{first dielectric constant})] \times 100$$

Thus, for example, if the first dielectric constant is 2.2, the second dielectric constant is 3.3, and the third dielectric constant is 2.3, then as calculated from the formula above, the third dielectric constant is 90.9% restored. Similarly, if the first dielectric constant is 2.2, the second dielectric constant is 4.0, and the third dielectric constant is 1.8, then as calculated from the formula above, the third dielectric constant is 122% restored.

Without intending to be bound by any particular theory, it is believed that the wet chemical compositions of the present invention employed to remove, for example, etch and ash residues, chemically modify the surfaces of the film in a manner that is synergistic with the above-described restoration process. Moreover, it is believed that the wet chemical cleaner according to the present invention increases the number of hydroxyl groups on the surface of the film, including the interior pore system, while not densifying the film or incorporating species, e.g. fluorine, that inhibit the restoration process.

In addition to the dielectric constant, the method of the present invention also restores material properties of the dielectric material such as, for example, breakdown voltage, leakage current, hydrophobicity, mechanical strength, carbon content, diffusion resistance, adhesion, modification of pore size, and hermeticity.

It will be appreciated that the invention is also contemplated to encompass methods of imparting a hydrophobic surface to silicon-containing, e.g., silica-containing, dielectric films, porous and/or nonporous, whether damaged or not, by application of the above-described plasma surface treatments. Microelectronic devices, such as semiconductor devices or ICs manufactured using these methods are also a part of the present invention.

The microelectronic devices, dielectric layers and materials may be utilized or incorporated into any suitable electronic component. Electronic components, as contemplated herein, are generally thought to comprise any dielectric component or layered dielectric component that can be utilized in an electronic-based product. Contemplated electronic components comprise circuit boards, integrated circuits, computer chips, memory devices, displays, photovoltaics, three-dimensional integration packaging, chip packaging, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, solar cells, portable memory devices, and a remote control. Also contemplated are "intermediate" products such as circuit boards, chip packaging, and keyboards that are potentially utilized in finished products.

Electronic products may also comprise a prototype component, at any stage of development from conceptual model to final scale-up mock-up. A prototype may or may not contain all of the actual components intended in a finished product, and a prototype may have some components that are constructed out of composite material in order to negate their initial effects on other components while being initially tested. Electronic products and components may comprise layered materials, layered components, and components that are laminated in preparation for use in the component or product.

Additional objects, advantages, and novel features of this invention will become apparent to those skilled in the art upon examination of the following examples thereof, which are not intended to be limiting.

EXAMPLES

Although the method of the present invention can be performed on any dielectric film, the following examples employ PDEMS™ 2.5 ATRP films. As used herein, the designation "PDEMS™ 2.5 ATRP film" refers to a film having a dielectric constant of about 2.5 prepared by the plasma enhanced chemical vapor deposition of a DEMS™ (diethoxymethylsilane) precursor and the porogen precursor ATRP (alpha-terpinene). The PDEMS™ 2.5 ATRP films were prepared according to the process disclosed in U.S. Pat. No. 6,846,515, which is incorporated herein by reference in its entirety.

Example 1

UV Curing (Gas Phase)

A PDEMS™ 2.5 ATRP film (CVD dielectric film prepared from DEMS™ and porogen) was damaged in etch, ash, and wet clean processes to remove carbon from the film causing the dielectric constant of the film to rise from 2.57 (first dielectric constant) to 2.87 (second dielectric constant) (film thickness 2791 A, RI=1.385). The sample was taken into a first vacuum chamber at 400° C. and vacuum for 5 minutes. After cooling the wafer, the wafer was transferred to a second vacuum chamber at 45 C. The chamber was pressurized to 12 torr with diethoxymethylsilane (no carrier). The sample was allowed to equilibrate for 2-3 minutes with the chemical vapor to aid in the diffusion of the chemistry into the pore system. The wafer was then transferred to a third vacuum chamber at 300° C. equipped with a sweeping broad band UV source (Fusion I-600 Lamp with H+ bulb). The sample was exposed to the UV radiation for 1 minute. The sample was removed from the chamber. The dielectric constant of the film decreased to 2.61 (third dielectric constant) (film thickness 2758A, RI=1.367). It appears that the same precursors that can be used for the deposition of PE-CVD films, e.g., DEMS™, can be adsorbed into the film and then UV cured to activate the DEMS™ molecule to interact with defects in the PDEMS™ network introduced by integration processing.

Example 2

UV Curing (Liquid Phase)

A 10 wt % solution of heptamethyldisilazane in 2-hexanone was mixed in a polypropylene bottle. A PDEMS™ 2.5 ATRP film (CVD dielectric film prepared from DEMS™ and porogen) was damaged in etch, ash, and wet clean processes to remove carbon from the film causing the dielectric constant of the film to rise from 2.53 (first dielectric constant) to 2.8 (second dielectric constant) (film thickness 3322 A, RI=1.338). A piece of this film was placed onto a spin coater. Approximately 3 mls of solution was placed on the film. The chemistry remained in contact with the film for 90 seconds before the restoration chemistry was removed via spin drying. The sample was moved to a vacuum chamber at 300 C equipped with a sweeping broad band UV source. The sample was exposed to 100% power UV light for 1 minute. After treatment the dielectric constant of the film was 2.46 (third dielectric constant) (film thickness 3215A, RI=1.346). This example shows that the choice of chemistry, e.g., a silazane, is effective at restoring the dielectric constant of the film to 100%. The combination of examples 1 and 2 illustrates that the UV process enables both gas and liquid phase processes for restoring dielectric properties.

Examples 3 and 4

For Examples 3 and 4, the following two wet chemical compositions according to the present invention were prepared and employed as a cleaner/stripper during the process by which an etched pattern was formed in a layer of silicon-containing dielectric material. The Compositions A and B are species of Compositions A and B above, respectively.

| Composition A | |
|---|---|
| | Wt. % |
| Water | 55 |
| Citric Acid (29%) | 0.5 |
| Glycerol | 39.3 |
| Ammonium citrate tribasic (50% solution) | 3.2 |
| $NH_4F$ (40%) | 2 |

| Composition B | |
|---|---|
| | Wt. % |
| Water | 90.00 |
| Acetic Acid | 0.50 |
| Propylene glycol | 4.40 |
| Dipropylene glycol monomethyl ether | 5.00 |
| $NH_4F$ (40%) | 0.10 |

PDEMS™ 2.5 ATRP films were damaged as a result of an ashing process. After exposure to the ash process (which included oxidative and reductive processes), the films were cleaned with a variety of wet chemical stripping compositions, washed with water, and dried with IPA vapor. There was no heating between the wet chemical stripper and restoration chemistry deposition (i.e., the silicon-containing fluid). As with many of the other processes used to make trenches and vias in the dielectric layers, this process resulted in higher or equivalent refractive index (RI), removal of carbon from the film, and an increase in the dielectric constant of the film. In Tables 1 and 2, "undamaged" refers to the PDEMS™ 2.5 film after UV cure but prior to any additional processing (i.e., the first dielectric constant).

Example 3

The 1 wt % MTAS in 2-pentanone solution used for this example was prepared by mixing 0.2 grams of MTAS with 19.8 grams of 2-pentanone in a polypropylene bottle. The solutions were deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were exposed to UV at 300° C. under vacuum for 1 minute. After curing the samples were allowed to equilibrate in a clean room environment (40-45% RH, 72° F.) for 3 days to allow the film to re-adsorb water. Reflectometry, Hg probe, and FTIR were used to evaluate the effectiveness of the restoration chemistry.

Table 1 illustrates that under both ashing conditions, using a wet chemical cleaner according to the present invention improves the performance of the final restored film. It is believed that carbon and fluorocarbon residues from the etch process or fluorine left from dilute HF wet chemical cleans interferes with the chemical reactions between the hydroxyl or hydride terminated surface and the silylating chemistry.

TABLE 1

| Film | Dielectric constant | Change in dielectric constant | % recovery after restoration |
|---|---|---|---|
| Undamaged | 2.5 | | |
| oxidative ash | 2.75 | 0.25 | |
| oxidative ash + MTAS/2-pentanone | 2.65 | 0.15 | 40 |
| oxidative ash + Composition A + MTAS/2-pentanone | 2.53 | 0.03 | 90 |
| oxidative ash + dilute HF + MTAS/2-pentanone | 2.70 | 0.20 | 20 |
| reductive ash | 2.65 | 0.15 | |
| reductive ash + MTAS/2-pentanone | 2.55 | 0.05 | 67 |
| reductive ash + Composition A + MTAS/2-pentanone | 2.45 | −0.05 | 130 |

Example 4

The 1 wt % MTAS in 2-pentanone solution used for this example was prepared by mixing 0.2 grams of MTAS with 19.8 grams of 2-pentanone in a polypropylene bottle. The solutions were deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were exposed to UV at 300° C. under vacuum for 1 minute. After curing the samples were allowed to equilibrate in a clean room environment (40-45% RH, 72° F.) for 3 days to allow the film to re-adsorb water. Reflectometry, Hg probe, and FTIR were used to evaluate the effectiveness of the restoration chemistry.

Table 2 shows that under oxidative ashing conditions, that buffered fluoride based cleaners or any cleaner that results in a hydroxylated surface prepares the surface for the restoration process improves the performance of the final restored film. It is believed that carbon and fluorocarbon residues from the etch process or fluorine left from dilute HF wet chemical cleans interferes with the chemical reactions between the hydroxyl or hydride terminated surface and the silylating chemistry. Buffered fluoride cleaners have the ability to minimize the fluorine in the surface, additional damage after the etching process, and changes in the electrical properties of the dielectric material. Without the ability to create a hydroxyl or hydride terminated surface for the silylating chemistry to react with, the stability of the restoration process to subsequent rinse steps, UV cures, or thermal cycling events used in the manufacturing of integrated circuits may be compromised. Lack of chemical stability after restoration could result in increased water adsorption that could desorb during pre-metal barrier deposition, electroplating, or packaging thereby causing pre-mature device failure.

TABLE 2

| Film | Dielectric constant | Change in dielectric constant | % recovery after restoration |
|---|---|---|---|
| Undamaged | 2.35 | | |
| Oxidative ash | 2.55 | 0.20 | |
| Oxidative ash + Composition A | 2.66 | 0.31 | |
| Oxidative ash + Composition A + MTAS/2-pentanone | 2.37 | 0.02 | 94 |
| Oxidative ash + Composition B | 2.62 | 0.27 | |
| Oxidative ash + Composition B + MTAS/2-pentanone | 2.34 | −0.01 | 100 |

Comparative Example

Prior Art Wet Chemical Compositions

The PDEMS™ 2.5 ATRP films were damaged through an oxidative ashing process. After exposure to the oxidative ash process, the films were cleaned with a variety of wet chemical stripping products, washed with water, and IPA vapor dried. There was no heating between the wet chemical stripper and restoration chemistry deposition. As with many of the other processes used to make trenches and vias in the dielectric layers, this process typically results in higher or equivalent refractive index (RI), removal of carbon from the film, and an increase in the dielectric constant of the film. In Table 3, "Undamaged" refers to the PDEMS™ 2.5 film after UV cure but prior to any additional processing (i.e., the first dielectric constant).

Several different compositions are shown in Table 3. The solutions were made by mixing the silylating agent with 2-pentanone, shaking, and allowing it to equilibrate for a minimum of 30 minutes. For example, 1 wt % methyltriacetoxysilane (MTAS) in 2-pentanone was prepared by mixing 0.2 grams of MTAS with 19.8 grams of 2-pentanone in a Teflon or polypropylene bottle. The solutions were deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were exposed to UV at 300° C. under vacuum for 1 minute. After curing the samples were allowed to equilibrate in a clean room environment (40-45% RH, 72° F.) for 3 days to allow the film to re-adsorb water. Reflectometry, Hg probe, and FTIR were used to evaluate the effectiveness of the restoration chemistry. This example shows that the chemistry and process to restore the film is capable of being used with wet chemical fluoride-based residue strippers.

TABLE 3

| Clean Chemistry | Restoration Chemistry | k After Wet Chemical Clean | k After Restoration | Δ Change Between Restore and Clean (% Recovered) |
|---|---|---|---|---|
| Undamaged | | | 2.57 | |
| EZStrip ™ 510 | 10% HMDS | 2.70 | 2.59 | −0.11 (85%) |
| EZStrip ™ 510 | 1% MTAS | 2.82 | 2.60 | −0.22 (88%) |
| EZStrip ™ 511 | 10% C7DSZ | 2.77 | 2.62 | −0.15 (75%) |
| EZStrip ™ 511 | 1% MTAS | 3.05 | 2.76 | −0.19 (60%) |
| EZStrip ™ 520 | 1% MTAS | 3.09 | 2.75 | −0.34 (65%) |
| Dilute HF | 1% MTAS | 2.82 | 2.65 | −0.17 (68%) |

MTAS = methyltriacetoxysilane;
HMDS = hexamethyldisilazane;
OMCTS = octamethyltetrasiloxane;
C7DSZ = heptamethyldisilazane;
EZStrip ™ Chemicals are available from Air Products and Chemicals, Inc., Allentown, Pennsylvania Comparing the information in Tables 1 and 2 with the information in Table 3 above, it is evident that prior art wet chemical stripping compositions do not contribute to the degree of dielectric constant restoration observed when the wet chemical compositions of the present invention are employed in the process.

Example 5

A porous low-dielectric constant film should be exposed to fluid for enough time to make a surface hydrophobic without any additional treatments. A PDEMS 2.2 film damaged in an oxygen plasma was exposed to a 1 wt % MTAS in 2-pentanone for greater than 3 minutes. One wafer was not rinsed and the other was rinsed with 1-pentanol. Table 4 shows that the dielectric constant of the unrinsed film is 80% higher than the damaged film, yet upon rinsing the dielectric constant is only slightly higher than the damaged film. Although the dielectric constant of the rinsed sample is similar to that of the damaged film, the Cv curves are non-typical for a low dielectric material suggesting that the film will have a high leakage current and reduced breakdown voltage.

TABLE 4

| Sample | Thickness | RI | Dielectric constant |
|---|---|---|---|
| MTAS exposed | 5251 | 1.4361 | 4.79 |
| MTAS exposed + 1-pentanol rinse | 5111 | 1.3600 | 2.79 |
| $O_2$ damaged PDEMS 2.2 | 5001 | 1.3413 | 2.64 |

Example 6

The solution properties of the silicon-containing fluid may need to be tailored to be able to wet a variety of surfaces or penetrate small patterned features. The viscosity, surface tension, solubility parameters, and dynamic surface tension may need to be varied to achieve proper wetting. These additives could be surfactants, flow additives used in the paint industry, or any other molecule that adjusts the wetting characteristics of the silicon-containing fluid. Additives such as these cannot affect the electrical, mechanical properties, or adhesive properties of the film. A typical preparation would be to make a 1 wt % MTAS in 2-pentanone solution to which 100 ppm of Voranol is added. The silicon-containing fluid was shaken for 2-3 minutes to make sure that a homogeneous solution is obtained. The solution was deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were exposed to UV at 300° C. under vacuum for 1 minute. After curing the samples were allowed to equilibrate in a clean room environment (40-45% RH, 72° F.) for 3 days to allow the film to re-adsorb water. Reflectometry, Hg probe, and FTIR were used to evaluate the effectiveness of the restoration chemistry. Table 5 shows that the choice of wetting agent and silicon-containing fluid is important to recover the dielectric constant of the film. The properties of the silicon-containing fluid are changed by adding each of these additives to the mixture.

TABLE 5

| Silicon containing Fluid | Flow Modifier | Thickness (Å) | RI | Dielectric constant |
|---|---|---|---|---|
| 10 wt % (dimethylamino)dimethylsilane | 0.1 wt % Rhodameen | 5338 | 1.3291 | 2.57 |
| 1 wt % methyltriacetoxysilane | 100 ppm Voranol | 5389 | 1.3736 | 2.53 |
| 10 wt % hexamethyldisilazane | 0.1 wt % Voranol | 5511 | 1.3338 | 2.56 |
| 10 wt % (dimethylamino)dimethylsilane | 0.1 wt % Brij 56 | 5313 | 1.3255 | 2.55 |
| 10 wt % hexamethyldisilazane | 0.1 wt % Brij 56 | 5513 | 1.3233 | 2.55 |
| 1 wt % hexamethylcyclotrisilazane | 100 ppm Byk 331 | 5167 | 1.3281 | 2.54 |
| 10 wt % hexamethyldisilazane | 0.1 wt % Byk 331 | 5237 | 1.3277 | 2.58 |
| 10 wt % (dimethylamino)dimethylsilane | 0.1 wt % Byk 331 | 5170 | 1.3222 | 2.59 |
| 1 wt % trimethylchlorosilane | 100 ppm Brij 56 | 5247 | 1.3220 | 2.69 |
| 10 wt % hexamethylcyclotrisilazane | 0.1 wt % Voranol | 5246 | 1.3712 | 2.83 |
| Oxygen damaged PDEMS 2.5 | NA | 5235 | 1.3691 | 2.82 |
| PDEMS 2.5 | NA | 5397 | 1.3845 | 2.58 |

Solvent used in all cases was 2-pentanone
Rhodameen = amine ethoxylate;
Voranol = branched polypropylene oxide;
Brij 56 = alcohol ethoxylate;
Byk 331 = flow modifier supplied by Byk Chemie (likely a modified poyldimethylsiloxane ethoxylate)

Example 7

The mechanical properties of a film are important for the performance of the film in an integrated structure. The application of a silicon-containing fluid and exposure to an energy source increases the mechanical properties of the film. The defects created by the plasma processes used to etch patterned features are removed and cross-linked together through the restoration process thereby increasing the mechanical properties of the film. A PDEMS 2.2 film was exposed to an oxygen plasma to simulate an oxidative, over-ash process. After exposure to the ash process, the films were cleaned with EZStrip 580 wet chemical stripping composition (described in U.S. Ser. No. 11/652,407 filed Jan. 11, 2007 the entire specification of which is incorporated herein in its entirety), washed with water, and dried with isopropyl alcohol (IPA) vapor. There was no heating between the wet chemical stripper and restoration chemistry deposition (i.e., the silicon-containing fluid). A 1 wt % solution of MTAS in 2-pentanone was prepared by mixing 0.2 g MTAS with 19.8 g of 2-pentanone. A second solution was also prepared as a comparison to the MTAS; 10 wt % HMDS in 2-pentanone was prepared by mixing 2 g of HMDS with 18 g of 2-pentanone. The silicon-containing fluid was shaken for 2-3 minutes to make sure that a homogeneous solution was obtained. The solution was deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were exposed to UV at 300° C. under vacuum for 1 minute. After curing the samples were allowed to equilibrate in a clean room environment (40-45% RH, 72° F.) for 3 days to allow the film to re-adsorb water. The modulus and hardness of the films were measured on a NANOINDENTER® Dynamic Contact Module (DCM) manufactured by MTS Systems Corporation with an ACCUTIP™ Berkovich diamond tip using the continuous stiffness measurement ("CSM") method. Table 6 shows that the damaged film has reduced mechanical properties yet upon repairing the film via restoration covering the film with a silicon containing fluid and exposure step the mechanical properties have increased, commensurate with increased network density without increasing the dielectric constant of the film.

TABLE 6

| Silicon containing fluid | Modulus (GPa) | Hardness (GPa) |
|---|---|---|
| 1 wt % MTAS with 1-pentanol rinse | 6.4 | 0.85 |
| 1 wt % MTAS -- no rinse | 5.9 | 0.90 |
| 10% HMDS | 5.2 | 0.72 |
| Oxygen damaged PDEMS 2.2 | 4.5 | 0.56 |
| PDEMS 2.2 | 4.9 | 0.62 |

Example 8

The rate at which alkoxysilanes react with hydroxyls is significantly slower than either chloro, amino, or acetoxy silanes. An additive may be added to the fluid to increase the activity of the silicon containing fluid without causing the fluid to produce particles or gel while storing under ambient conditions. Surprisingly, the activity of methyltriethoxysilane (MTES) with additives in the fluid produces similar results as the chloro or amino silanes. The solutions used for this example were prepared by mixing 0.2 g MTES with 19.35 g of 2-pentanone. 0.34 g of acetic acid was added to this mixture. The mixture was shaken for 1-2 minutes to which 0.11 g of 1 M HNO₃ was added resulting in the final mixture. This will be denoted solution A. A second formulated mixture was prepared in the same manner as solution A except that the MTES was added to 19.24 g of 2-pentanone and 0.22 g of 2 M acetic acid replaced the 1 M $HNO_3$. This fluid will be denoted solution B. The third solution, denoted solution C, is prepared by mixing 0.2 g MTAS with 19.8 g of 2-pentanone. The solution was deposited onto the wafer for a time period of 5 seconds to 300 seconds after which the solution was removed by spin drying. The films were spun for 30 seconds at 300 rpm, 10 seconds at 500 rpm, and 60 seconds at 800 rpm. The films were exposed to UV at 300° C. under vacuum for 1 minute. After curing the samples were allowed to equilibrate in a clean room environment (40-45% RH, 72° F.) for 3 days to allow the film to re-adsorb water. Reflectometry, Hg probe (capacitance, leakage current density, breakdown voltage), and FTIR were used to evaluate the effectiveness of the restoration chemistry. The modulus and hardness of the films were measured on a NANOINDENTER® Dynamic Contact Module (DCM) manufactured by MTS Systems Corporation with an ACCUTIP™ Berkovich diamond tip using the continuous stiffness measurement ("CSM") method. Table 7 shows the performance of the solution A and B are equivalent to solution C. The extra degrees of freedom added to the mixture allows for improved performance.

TABLE 7

| Silicon containing fluid | Dielectric constant | Modulus (GPa) | Leakage current density (A/cm$^2$) | Breakdown voltage (MV/cm) |
|---|---|---|---|---|
| Solution A | 2.48 | 6.75 | $1.3 \times 10^{-10}$ | 4.02 |
| Solution B | 2.48 | 5.87 | $1.7 \times 10^{-11}$ | 3.87 |
| Solution C | 2.50 | 6.25 | $6.1 \times 10^{-11}$ | 4.08 |
| Oxygen damaged PDEMS 2.2 | 2.75 | 4.48 | $1.6 \times 10^{-8}$ | 2.00 |
| PDEMS 2.2 | 2.35 | 4.90 | $9.6 \times 10^{-10}$ | 3.81 |

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

We claim:

1. A method for preparing an interlayer dielectric to minimize damage to the interlayer's dielectric properties, the method comprising the steps of:
    depositing a layer of a silicon-containing dielectric material onto a substrate, wherein the layer has a first dielectric constant and wherein the layer has at least one surface;
    providing an etched pattern in the layer by a method that includes at least one etch process and exposure to a wet chemical composition to provide an etched layer, wherein the etched layer has a second dielectric constant, and wherein the wet chemical composition contributes from 0 to 40% of the second dielectric constant;
    contacting the at least one surface of the layer with a silicon-containing fluid;
    removing a first portion of the silicon-containing fluid such that a second portion of the silicon-containing fluid remains in contact with the at least one surface of the layer; and
    exposing the at least one surface of the layer to an energy source comprising UV radiation, wherein the layer has a third dielectric constant that is restored to a value that is at least 90% restored relative to the second dielectric constant.

2. The method of claim 1 wherein the energy source also comprises thermal energy.

3. The method of claim 1 wherein the wet chemical composition comprises:
    a. a fluoride ion source;
    b. a pH buffer system comprising a polyprotic acid having at least three carboxylic acid groups and its conjugate base;
    c. a solvent having at least one polyhydric alcohol; and
    d. water.

4. The method of claim 3 wherein the wet chemical composition consists essentially of from about 25 to about 50 weight percent glycerol; from about 40 to about 70 weight percent water; from about 0.5 to about 1.5 weight percent of a 29% solution of citric acid; from about 3 to about 7 weight percent of a 50% solution of ammonium citrate tribasic; and from about 1 to about 5 weight percent of 40% solution of ammonium fluoride.

5. The method of claim 4, wherein the wet chemical composition consist essentially of 55.0 weight percent of water; 0.5 weight percent of Citric Acid (29%); 39.3 weight percent of Glycerol; 3.2 weight percent of Ammonium citrate tribasic (50% solution); and 2.0 weight percent of $NH_4F$ (40%).

6. The method of claim 1 wherein the wet chemical composition comprises: water; acetic acid; propylene glycol; dipropylene glycol monomethyl ether; and ammonium fluoride.

7. The method of claim 6 wherein the wet chemical composition consists essentially of from about 70 to about 90 weight percent of water; from about 0.2 to about 1.0 weight percent of a glacial acetic acid solution; from about 1.0 to about 10 weight percent of propylene glycol; from about 1.0 to about 10 weight percent of dipropylene glycol monomethyl ether; and from about 0.05 to about 0.3 weight percent of a 40% solution of ammonium fluoride.

8. The method of claim 7, wherein the wet chemical composition consists essentially of 90.00 weight percent of water; 0.50 weight percent of Acetic Acid; 4.40 weight percent of Propylene glycol; 5.00 weight percent of Dipropylene glycol monomethyl ether; and 0.10 weight percent of $NH_4F$ (40%).

* * * * *